US011302729B2

(12) United States Patent
Pere Laperne et al.

(10) Patent No.: US 11,302,729 B2
(45) Date of Patent: Apr. 12, 2022

(54) DEVICE FOR IMPROVED MULTISPECTRAL DETECTION

(71) Applicant: LYNRED, Palaiseau (FR)

(72) Inventors: Nicolas Pere Laperne, Grenoble (FR); Pierre Jenouvrier, L'Isle d'Abeau (FR); Yann Reibel, Veurey-Voroise (FR)

(73) Assignee: Lynred, Palaiseau (FR)

( * ) Notice: Subject to any disclaimer, the term of this patent is extended or adjusted under 35 U.S.C. 154(b) by 0 days.

(21) Appl. No.: 16/465,877

(22) PCT Filed: Dec. 5, 2017

(86) PCT No.: PCT/FR2017/053405
§ 371 (c)(1),
(2) Date: May 31, 2019

(87) PCT Pub. No.: WO2018/104655
PCT Pub. Date: Jun. 14, 2018

(65) Prior Publication Data
US 2019/0296068 A1 Sep. 26, 2019

(30) Foreign Application Priority Data
Dec. 7, 2016 (FR) ...................................... 1662090

(51) Int. Cl.
H01L 27/146 (2006.01)
(52) U.S. Cl.
CPC .. *H01L 27/14621* (2013.01); *H01L 27/14618* (2013.01); *H01L 27/14649* (2013.01); *H01L 27/14652* (2013.01); *H01L 27/14669* (2013.01)

(58) Field of Classification Search
CPC ......... H01L 27/14621; H01L 27/14649; H01L 27/14669; H01L 27/14618; H01L 27/14652
See application file for complete search history.

(56) References Cited

U.S. PATENT DOCUMENTS 4,996,427 A * 2/1991 Noble .................... G01J 3/2823
250/332
5,258,618 A * 11/1993 Noble ........................ G01J 5/08
250/332
(Continued)

FOREIGN PATENT DOCUMENTS

| CN | 203883014 U | 10/2014 |
| EP | 2 117 047 A1 | 11/2009 |

(Continued)

OTHER PUBLICATIONS

Feb. 21, 2018 International Search Report issued in International Patent Application PCT/FR2017/053405.

*Primary Examiner* — Christine S. Kim
(74) *Attorney, Agent, or Firm* — Oliff PLC

(57) ABSTRACT

The detection device includes first and second photodetectors each sensitive to two different wavelength ranges. The detection device comprises a first filter configured to allow the first wavelength range to pass and to block the second wavelength range. The first filter covers the first photodetector and leaves the second photodetector uncovered. The detection device comprises a second filter located at a distance from the first and second photodetectors and at a distance from the first filter. The second filter is configured to allow the first and the second wavelength ranges to pass. A processing circuit is configured to receive electric signals coming from the first and second photodetectors and to (Continued)

provide data relative to the radiation of the second wavelength range by comparing the first signal with the second signal.

12 Claims, 10 Drawing Sheets

(56) References Cited

U.S. PATENT DOCUMENTS

| | | | |
|---|---|---|---|
| 7,109,488 B2 | 9/2006 | Milton | |
| 8,749,636 B2* | 6/2014 | Brown | ................... G01J 3/2823 |
| | | | 348/164 |
| 2009/0114820 A1* | 5/2009 | Murphy | ..................... G01J 3/32 |
| | | | 250/339.01 |
| 2011/0140222 A1* | 6/2011 | Rhodes | ............. H01L 21/76837 |
| | | | 257/432 |
| 2012/0133799 A1* | 5/2012 | Findlay | ................. G01S 7/4816 |
| | | | 348/241 |
| 2013/0188057 A1 | 7/2013 | Lin | |
| 2014/0034603 A1 | 2/2014 | Wehner | |
| 2016/0080669 A1 | 3/2016 | Chou et al. | |
| 2020/0309601 A1* | 10/2020 | Marinsek | ............... G01J 5/0205 |

FOREIGN PATENT DOCUMENTS

| | | |
|---|---|---|
| EP | 2 442 555 A2 | 4/2012 |
| EP | 2 827 375 A1 | 1/2015 |
| EP | 3 133 646 A2 | 2/2017 |
| WO | 2015/189423 A1 | 12/2015 |

* cited by examiner

DEVICE FOR IMPROVED MULTISPECTRAL DETECTION

BACKGROUND OF THE INVENTION

The invention relates to a multispectral detection device.

The invention also relates to a method for fabricating a multispectral detection device.

STATE OF THE ART

In the field of detection devices, in order to capture a maximum amount of data on a scene that is being observed, it is advantageous to use several different spectral wavebands.

Several detectors are used and are assigned to different spectral wavebands. In this way, each detector captures a specific data item of the observed scene which facilitates analysis by cross-checking the different data.

A simple way of fabricating a detection device is to associate several different photodetectors configured to detect a specific spectral waveband. Each photodetector is associated with a readout circuit that will store the electric charges representative of the received data.

The electric information generated is then sent to a processing circuit that analyses the different data to provide information usable by the user.

In conventional manner, the detection device comprises first photodetectors fabricated with a first architecture and with first semiconductor materials so as to detect radiation in a first spectral waveband. The detection device also comprises second photodetectors presenting a second architecture that can be different from the first architecture. The second photodetectors are made from second semiconductor materials different from the first semiconductor materials so as to detect radiation in the second spectral waveband.

Such an embodiment is complicated to implement as it requires fabrication of two different stacks with different semiconductor materials to form two different types of photodetectors.

As an alternative, it is proposed to fabricate first and second photodetectors that are both sensitive to the first spectral waveband and to the second spectral waveband.

In order to specialise the photodetectors on the first spectral waveband or on the second spectral waveband, filters are associated with each of the photodetectors. First filters are placed above the first photodetectors only so as to only allow the first spectral waveband to pass. Second filters are placed above the second photodetectors only so as to only allow the second spectral waveband to pass. Such a teaching is described in the document CN203883014.

It is however apparent that such an embodiment is also very complicated to implement as it requires provision of a first filter above the first photodetectors and provision of a second filter above the second photodetectors. The two filters therefore have to be formed on the photodetector array.

A substantially equivalent teaching is described in the document US 2014/0034603. In this document, a multispectral filter is arranged above the photodetectors. This multispectral filter comprises several different filters allowing different wavelengths to pass thereby dissociating the incident radiation.

An alternative embodiment is described in the document U.S. Pat. No. 7,109,488 describing a multicolour detection device in the infrared range. First and second pixels are defined in a photodetector array. The first and second pixels are defined by different first and second filters associated with different photodetectors.

The first filter allows infrared radiation to pass up to a wavelength of 9 microns. The photodetector is configured to detect a radiation comprised between 7 and 9 microns. The pixel will therefore deliver a signal representative of the radiation comprised between 7 and 9 microns.

The second filter allows infrared radiation to pass up to a wavelength of 10 microns. The associated photodetector is configured to detect a radiation comprised between 7 and 9 microns and a radiation comprised between 9 and 10 microns. The second pixel will therefore deliver a signal representative of the radiation comprised between 7 and 10 microns.

Another alternative embodiment is described in the document WO 2015/189423 that relates to bispectral matrix sensors. This document proposes manufacturing identical photodetectors to form a monotype matrix sensor. Here again, a complex filtering system enables the photodetectors to be specialised so that one part of the photodetectors observes a first spectral waveband and another part of the photodetectors observes another spectral waveband.

All the detectors are covered by a dual-band interference filter configured to allow the radiation of a first spectral waveband and of a second spectral waveband to pass.

A part of these photodetectors is covered by a low-pass filter so as to only receive the radiation of the first spectral waveband. The other part of these photodetectors is covered by a high-pass filter so as to only receive the radiation of the second spectral waveband.

It is apparent that this solution is particularly complex to implement and costly.

OBJECT OF THE INVENTION

One object of the invention is to provide a multispectral detection device that can be more easily fabricated and can be more compact.

The multispectral detection device comprises:
- a first photodetector and a second photodetector each sensitive to a first wavelength range and to a second wavelength range different from the first wavelength range, the first photodetector delivering a first signal representative of the received radiation and the second photodetector delivering a second signal representative of the received radiation,
- a first filter configured to allow the first wavelength range to pass and to block the second wavelength range, the first filter covering the first photodetector and leaving the second photodetector uncovered, the first filter being in contact with the first photodetector so as to prevent the second wavelength range from passing in the first photodetector,
- a second filter located at a distance from the first and second photodetectors and at a distance from the first filter, the second filter being configured to allow the first wavelength range and the second wavelength to pass, the second filter being configured to block a wavelength higher than the longest of the wavelengths of the first and second wavelength ranges and/or to block a wavelength lower than the shortest of the wavelengths of the first and second wavelength ranges.

In one development, the second photodetector is devoid of a filter configured to block the first wavelength range so as to receive the first wavelength range and the second wavelength range, the detection device comprising a processing circuit configured to receive electric signals from the first and second photodetectors and to provide data relative to the radiation of the second wavelength range by comparing the first signal with the second signal.

As an alternative, the second photodetector is covered by a third filter configured to block the first wavelength range and to allow the second wavelength range to pass.

In an advantageous embodiment, the second filter is chosen from low-pass, high-pass, band-pass and dual-band filters.

Preferentially, the first filter is a low-pass, high-pass or bandpass filter cutting off the second wavelength range.

It is advantageous to provide for the second filter to be located at a distance from the first filter and from the second photodetector, separated by a layer of gas or vacuum.

In one embodiment, the detection device comprises a cold shield configured to focus the incident radiation by means of an aperture for passage of the radiation and the second filter is located in said aperture.

Preferentially, the cold shield defines a closed enclosure containing the first and second photodetectors and the second filter is located in the closed enclosure.

As an alternative, the cold shield defines a closed enclosure containing the first and second photodetectors and the second filter is located outside the closed enclosure.

It is a further object of the invention to provide a method for fabricating a multispectral detection device that is simpler to implement.

The method for fabricating a multispectral detection device comprises the following steps:
  providing a substrate comprising first and second photodetectors each sensitive to a first wavelength range and to a second wavelength range different from the first wavelength range, the first photodetector delivering a first signal representative of the received radiation and the second photodetector delivering a second signal representative of the received radiation,
  forming a first filter configured to allow the first wavelength range to pass and to block the second wavelength range, the first filter covering the first photodetector and leaving the second photodetector uncovered, the first filter being in contact with the first photodetector so as to prevent the second wavelength range from passing in the first photodetector,
  forming a second filter arranged at a distance from the first and second photodetectors and at a distance from the first filter, the second filter being configured to allow the first wavelength range and the second wavelength range to pass, the second filter being configured to block a wavelength higher than the longest of the wavelengths of the first and second wavelength ranges and/or to block a wavelength lower than the shortest of the wavelengths of the first and second wavelength ranges.

In a particular development, the method comprises, before the second filter is formed:
  forming a third filter configured to allow the second wavelength range to pass and to block the first wavelength range, the third filter covering the second photodetector and leaving the first photodetector uncovered, the third filter being in contact with the second photodetector so as to prevent the first wavelength range from passing in the second photodetector.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
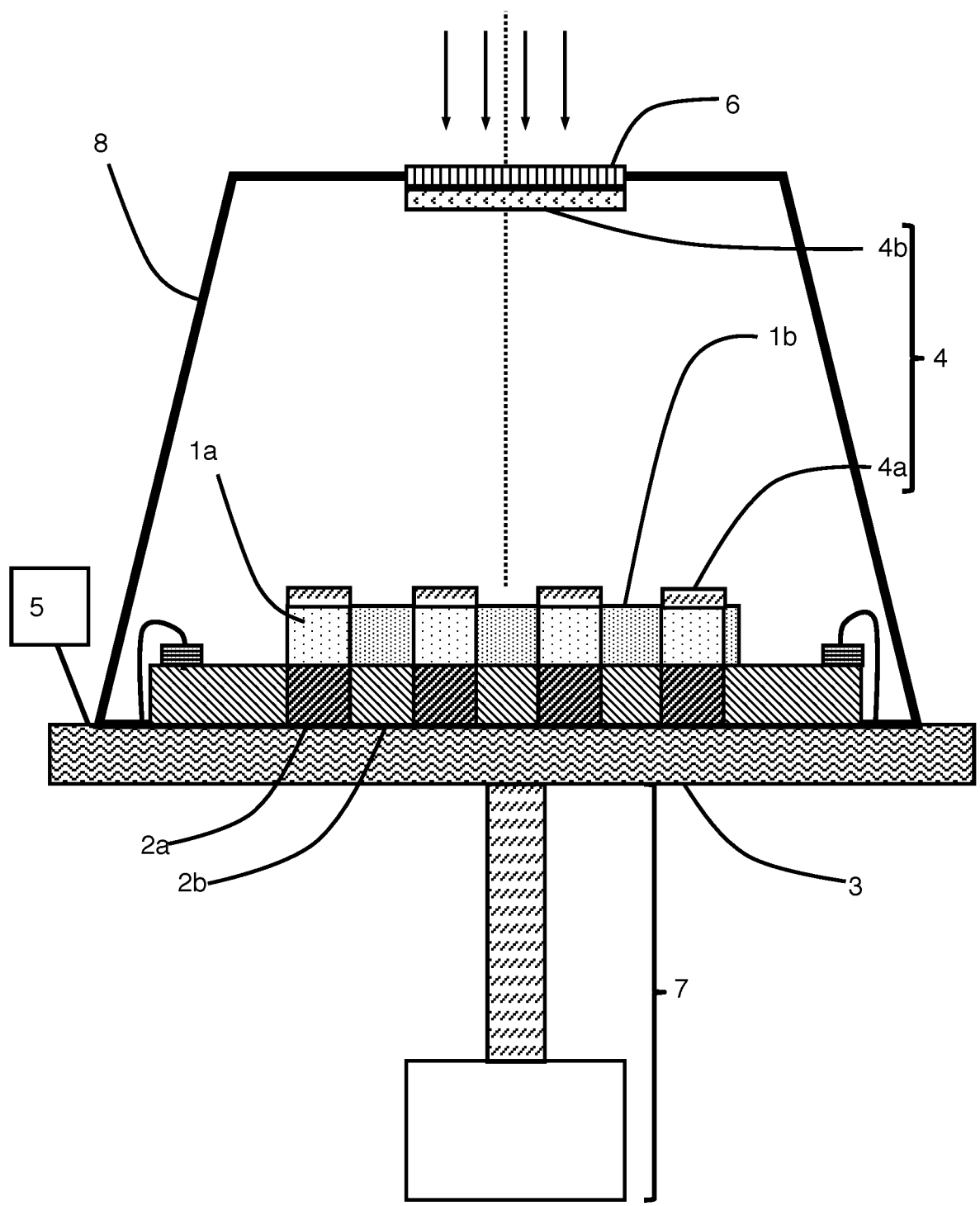
FIGS. 1 and 2 represent two alternative embodiments of a detection device provided with two photodetectors and with a filter on the cold shield, in schematic manner.
Figure 2:
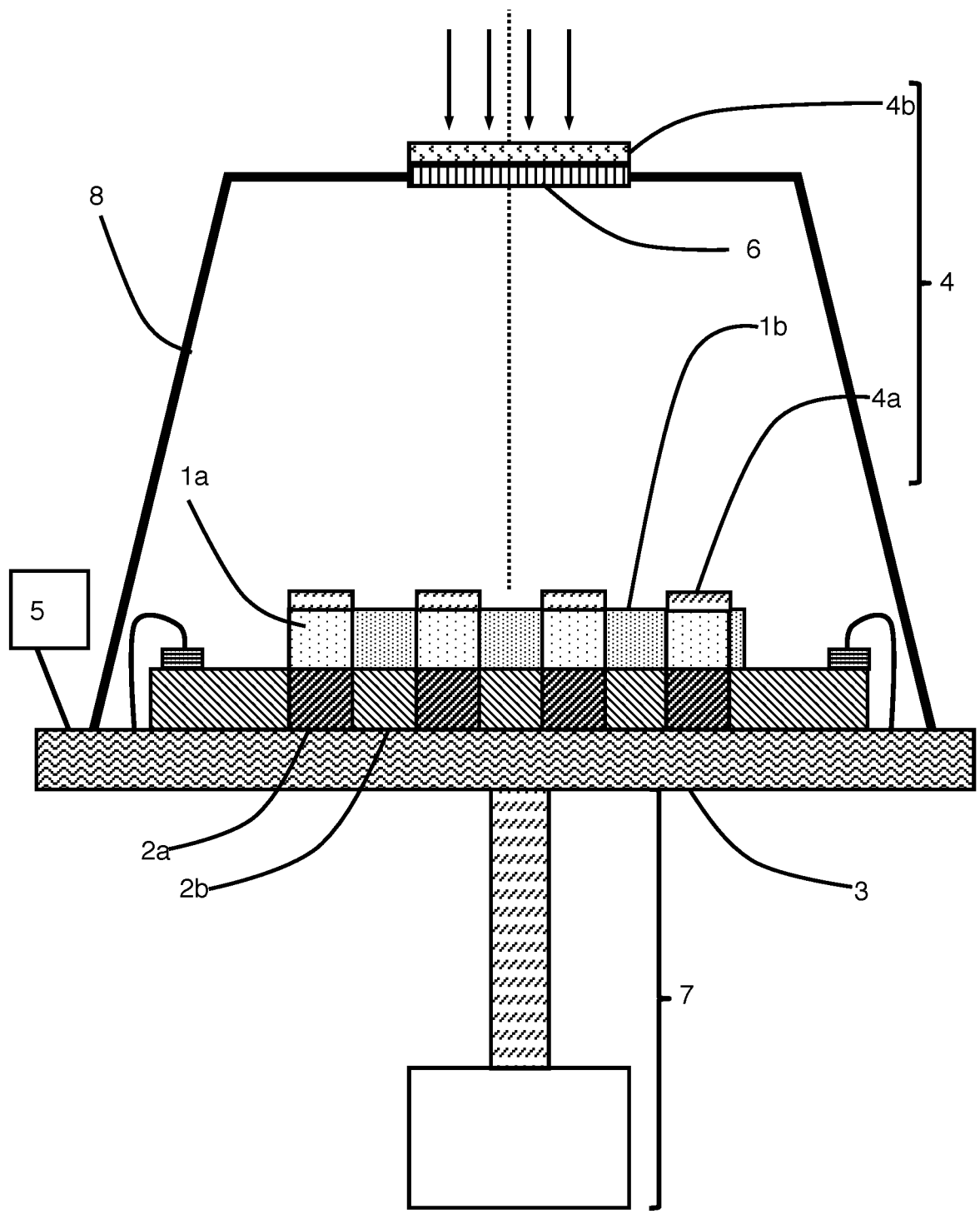

FIGS. 1 and 2 illustrate a multispectral detection device comprising at least a first photodetector $1a$ sensitive to a first wavelength range also called first spectral waveband and a second photodetector $1b$ sensitive to a second wavelength range also called second spectral waveband.

In a particular embodiment, first photodetector $1a$ and second photodetector $1b$ comprise a single semiconductor film that is configured to absorb the first wavelength range and the second wavelength range. This embodiment is particularly advantageous as it is very compact.

In an alternative embodiment, first photodetector $1a$ and second photodetector $1b$ each comprise distinct first and second semiconductor films respectively configured to capture the first wavelength range and the second wavelength range.

These two embodiments are advantageous as the two photodetectors can be fabricated simultaneously which makes the manufacturing method and the integration density easier.

In an advantageous embodiment, the multispectral detection device comprises a plurality of first photodetectors and a plurality of second photodetectors. In advantageous manner, the first photodetectors and second photodetectors form an array. It is particularly advantageous to provide for the first photodetectors and second photodetectors to be uniformly distributed over the detection surface.

In an advantageous embodiment, the plurality of first photodetectors and the plurality of second photodetectors form a focal plane array, i.e. all the photodetectors are arranged in the same plane.

In preferential manner, the detection device comprises as many first photodetectors as second photodetectors. As an alternative, it is also possible to provide for the detection device to comprise a number of first photodetectors that is different from the number of second photodetectors.

In a particular embodiment, the second wavelength range is different from the first wavelength range. In advantageous manner, the second wavelength range is dissociated from the first wavelength range, i.e. the wavelength ranges do not overlap. Depending on the embodiments, the first and second wavelength ranges have a common boundary or they are separated by an intermediate wavelength range.

First photodetector 1a and second photodetector 1b are both sensitive to the first wavelength range and to the second wavelength range. In other words, first photodetector 1a and second photodetector 1b are able to capture the radiation emitted in the first wavelength range and to provide an electric signal representative of this radiation. First photodetector 1a and second photodetector 1b are also able to capture the radiation emitted in the second wavelength range and to provide an electric signal representative of this radiation.

It is also possible for first photodetector 1a and second photodetector 1b to be able to capture the radiation emitted in a third wavelength range that is different from the first and second wavelength ranges. This third wavelength range does not contain any relevant data, but it facilitates fabrication of the photodetectors by choosing semiconductor materials that are easier to use.

In advantageous manner, the first and second wavelength ranges are infrared radiation ranges. In a particular embodiment, the first wavelength range and second wavelength range are chosen from the following ranges:
NIR: between 0.8 µm and 1.4 µm
SWIR: between 1.4 µm and 3 µm,
MWIR: between 3 µm and 8 µm,
LWIR: between 8 µm and 15 µm.

It is therefore possible to configure the detection device so that the latter can detect different pairs of wavelength ranges, for example MWIR/LWIR, MWIR/SWIR, LWIR/SWIR, NIR/SWIR, NIR/LWIR or NIR/MWIR.

It is further possible to break the different ranges presented above down into two different sub-ranges. In a particular embodiment, the first and second wavelength ranges for example divide the MWIR radiation into two distinct sub-ranges. The same can be the case for the LWIR, SWIR or NIR radiations.

First and second photodetectors 1a and 1b can be formed by any suitable type of detector, for example by a photodiode, a quantum well detector or a multiquantum well detector. Other types of photodetectors are also possible. First and second photodetectors 1a and 1b can be provided with identical or different architectures. In advantageous manner, first photodetector 1a is identical to second photodetector 1b, i.e. as far as the materials and its fabrication architecture are concerned. It is then much easier to fabricate the photodetectors in compact manner.

The supply conditions of photodetectors 1a and 1b can be different. Advantageously, the supply conditions are identical for all the photodetectors. The supply conditions are provided by a first readout circuit 2a for first photodetector 1a and by a second readout circuit 2b for second photodetector 1b.

Photodetectors 1a and 1b and readout circuits 2a and 2b are advantageously arranged on a support 3.

In order to specialise first and second photodetectors 1a and 1b, the photodetectors are associated with a filtering system 4 of the incident radiation. Filtering system 4 is configured so that first photodetector 1a receives a different radiation from second photodetector 1b. In this way, the two photodetectors 1a and 1b are able to provide two different data items on the observed scene.

As indicated in the foregoing, the use of identical photodetectors makes it easier to achieve a compact device. However, the compactness is such that it becomes difficult to provide different high-performance filters above first photodetector 1a and above second photodetector 1b.

In order to facilitate accomplishment of an efficient detection device, filtering system 4 is a dissociated filtering system, i.e. it comprises at least a first filter 4a and a second filter 4b that present different optic properties and that are arranged successively in the optic path of first photodetector 1a. First filter 4a and second filter 4b are not in contact with one another which makes filtering system 4 easier to accomplish. First filter 4a presents optic and preferentially mechanical characteristics that are different from second filter 4b.

The use of two dissociated and consecutive filters in the optic path enables the thickness of the filter arranged in contact with the photodetector to be reduced as compared with an equivalent filter that is also in contact with the photodetector.

Typically, the thickness of the filter is substantially equal to the cut-off frequency wavelength. Therefore, for a photodetector configured to absorb a radiation in the 3-5 µm range, the equivalent filter presents a thickness substantially comprised between 3 µm and 5 µm.

It is clearly apparent that such a thickness gives rise to a manufacturing problem for photodetector arrays that have a repetition pitch of less than 30 µm. The problem of integration is even more critical for photodetector arrays having a repetition pitch of less than 20 µm. Considerable manufacturing problems arise for photodetector arrays with a repetition pitch of less than 15 µm and in particular when the filter has a thickness equal to 5 µm.

It is further apparent that to enhance the performances of the filter and in particular to increase its ability to efficiently block a part of the incident radiation, the number of layers forming the filter has to be increased thereby increasing the thickness of the filter. For example, to increase the rejection capability of the filter, i.e. its ability to block the incident radiation, by 10% as compared with a reference filter, the increase of the thickness is about 2 µm.

It is also apparent that for detection devices operating at low temperature, typically less than 0° C., the filter introduces large thermomechanical stresses in the photodetector thereby impairing the performances of the detection device. The thermomechanical stresses increase as and when the thickness increases.

Filtering system 4 comprises a first filter 4a that is configured to allow the first wavelength range to pass and to block the second wavelength range. First filter 4a can be an interference filter or an absorption filter.

Depending on the embodiments, the first wavelength range can present longer or shorter wavelengths than the second wavelength range. First filter 4a can therefore be a low-pass filter or a high-pass filter the cut-off wavelength of which is located between the first wavelength range and the second wavelength range. This embodiment is particularly advantageous as low-pass and high-pass filters are easy to produce thereby simplifying integration of the latter at the surface of the photodetectors. They are generally less thick than other filters.

As an alternative, it is also possible to provide for first filter 4a to be a bandpass filter that allows the first wavelength range to pass and that blocks the second wavelength range. This embodiment is slightly less advantageous than the previous embodiment as a bandpass filter is generally thicker than a low-pass or high-pass filter.

First filter 4a is a filter that is placed directly on first photodetector 1a, i.e. on a part of the focal plane array. First filter 4a is not placed on second photodetector 1b so that first filter 4a covers first photodetector 1a and leaves second photodetector 1b uncovered. First filter 4a is in physical contact with first photodetector 1a. First filter 4a limits the crosstalk between first photodetector 1a and adjacent second photodetector 1b.

By means of this particular configuration, first photodetector 1a only receives a part of the incident radiation. First photodetector 1a receives the first wavelength range and does not receive the second wavelength range.

To efficiently eliminate parasite radiation, filtering system 4 also comprises a second filter 4b. Second filter 4b is used to block a part of the incident radiation before being captured by first and second photodetectors 1a and 1b. More precisely, second filter 4b is used to block a part of the incident radiation before striking the focal plane and in particular first filter 4a which will block another part of the incident radiation.

Second filter 4b is located at a distance from first photodetector 1a and second photodetector 1b, i.e. second filter 4b is not in direct contact with first photodetector 1a or with second photodetector 1b.

Second filter 4b is placed on a second substrate that is different from the first substrate supporting the first and second photodetectors or on which the first and second photodetectors are formed.

Depending on the embodiments, second filter 4b can be an interference filter or an absorption filter.

First filter 4a and second filter 4b work in association to filter the radiation received by first photodetector 1a.

By separating first filter 4a and second filter 4b, it is possible to obtain a global filter capable of only allowing the relevant radiation to pass in the direction of the first photodetector while at the same time limiting the thickness of first filter 4a formed directly on the first photodetector. In this way, it is possible to form more compact first filters.

Second filter 4b is separated from photodetectors 1a and 1b and from first filter 4a by a layer of gas or vacuum. In this way, the thermomechanical stresses linked to second filter 4b are greatly reduced or even eliminated. It is then easier to form first filter 4a and second filter 4b. The thickness of the first filter can be reduced thereby reducing the thermomechanical stresses.

In a particular embodiment, second filter 4b is advantageously relocated to the substrate containing first photodetector 1a and second photodetector 1b.

Second filter 4b can then be formed separately from first filter 4a and the manufacturing method of second filter 4b does not interfere with first filter 4a or with photodetectors 1a and 1b.

In an alternative embodiment, second filter 4b is advantageously relocated to support 3 which is configured to support the substrate containing first photodetector 1a and second photodetector 1b. There again, second filter 4b can then be formed separately from first filter 4a and the manufacturing method of second filter 4b does not interfere with first filter 4a or with photodetectors 1a and 1b.

Second filter 4b being located at a distance from filter 4a and from photodetectors 1a and 1b, it is advantageous to provide for second filter 4b to be a filter common to first photodetector 1a and second photodetector 1b. In this way, second filter 4b is not bound by an alignment constraint with respect to first filter 4a, or to second photodetector 1b. Second filter 4b is located between the radiation source and first filter 4a and also between the radiation source and second photodetector 1b. As second filter 4b is located at a distance from first filter 4a and from the photodetectors, the manufacturing and integration constraints are reduced in comparison with devices of the prior art.

Advantageously, second filter 4b is configured to allow the first wavelength range and the second wavelength range to pass. Second filter 4b is advantageously configured to block the third wavelength range that is different from the first and second wavelength ranges.

In advantageous manner, second filter 4b is a band-stop filter. It is also possible to provide a low-pass or high-pass or dual-lobe filter.

Depending on the embodiments, in non-exhaustive manner, second filter 4b can be configured to block the wavelengths outside the following ranges:

0.8 µm-3 µm, to capture NIR and SWIR radiations,
1.4 µm-8 µm, to capture SWIR and MWIR radiations,
3 µm-15 µm, to capture MWIR and LWIR radiations,
0.8 µm-1.4 µm, to capture NIR radiation,
1.4 µm-3 µm, to capture SWIR radiation,
3 µm-8 µm, to capture MWIR radiation,
8 µm-15 µm, to capture LWIR radiation.

In this way, filtering system 4 prevents certain wavelengths from reaching first and second photodetectors 1a/1b and from polluting the useful signals received.

In a particular embodiment, second photodetector 1b is devoid of a filter arranged in direct contact with its surface. In this configuration, second photodetector 1b receives the first wavelength and the second wavelength as it is not associated with first filter 4a. This embodiment is particularly advantageous as only first photodetector 1a is covered by a first filter 4a thereby facilitating fabrication of the detection device with photodetectors of small dimensions.

First photodetector 1a emits an electric signal that is representative of the received radiation. The electric signal coming from first photodetector 1a is representative of the radiation in the first wavelength range only.

Second photodetector 1b also emits an electric signal that is representative of the received radiation. The electric signal coming from second photodetector 1b is representative of the radiation in the first wavelength range and in the second wavelength range.

In order to obtain a signal representative of the radiation in the second wavelength range, it is advantageous to compare the electric signal coming from first photodetector 1a with the electric signal coming from second photodetector 1b.

The differences of data between the two signals are representative of the radiation in the second wavelength range.

In advantageous manner, first photodetector 1a is connected to a readout/processing circuit 5 that receives the first electric signal. Second photodetector 1b is also connected to readout/processing circuit 5 that receives the second electric signal. Readout/processing circuit 5 is configured to compare the first electric signal with respect to the second electric signal and to provide a third signal representative of the radiation received by second photodetector 1b in the second wavelength range. In one embodiment, the readout/processing circuit can be formed in substrate 3. It is further possible to dissociate the read and processing functions and to perform the read function in support 3. The processing function is then performed elsewhere.

It is advantageous to use a second filter 4b that is a high-pass filter or a low-pass filter. Second filter 4b is then configured to allow the first wavelength range and the second wavelength range to pass and to block a wavelength higher than the longest of the wavelengths in the first and second wavelength ranges or to block a wavelength lower than the smallest of the wavelengths in the first and second wavelength ranges.

It is also advantageous to use a second filter 4b having a cut-off wavelength that corresponds to one of the ends of the set formed by the first and second wavelength ranges. A part of the fabrication hazards of the photodetectors is thereby eliminated.

It is particular advantageous to provide for the use of a second filter 4b that is a bandpass filter having a lower cut-off wavelength and an upper cut-off wavelength that correspond to the ends of the interval defined by the first and second wavelength ranges. A part of the fabrication hazards of the photodetectors is thereby eliminated.

As a variant, second filter 4b can be a dual-lobe filter also called dual-band filter that is more complicated to produce and that is thicker. The dual-band filter is configured to allow the first wavelength range and the second wavelength range to pass. This filter enables a better selection of the useful wavelengths. The complexity of fabrication and its larger thickness are no longer problems as the filter is located away from the photodetectors.

Second filter 4b allows the first wavelength range and the second wavelength range to pass and at least partially or even totally excludes the radiation in the wavelength ranges that are not required.

The inventors observed that this embodiment is particularly advantageous compared with embodiments of the prior art. In the documents of the prior art, it is in fact proposed to place a first filter on the first photodetector and a different second filter on the second photodetector.

The two filters used have substantial thicknesses that may be in the same order of magnitude as the lateral dimension of the photodetector. It is therefore difficult to fully master fabrication of a detection matrix with a small pitch between the photodetectors.

By using a single filter, here first filter 4a, to specialise the first photodetectors with respect to the second photodetectors, it is easier to fabricate a detection matrix with a small repetition pitch. The alignment constraints are limited to first filter 4a in the fabrication method.

The use of a single first filter 4a configured to allow the first wavelength range to pass and to block the second wavelength range has the advantage of being simple to achieve. The constraints relating to the subsequent deposition and etching steps or by lift-off to form another filter on the substrate containing the photodetectors no longer exist. First filter 4a can be a slim filter and the technological steps to form this first filter are reduced thereby reducing the risks of impairment of the first and/or second photodetectors to the same extent.

It is particularly advantageous to choose the low-pass, high-pass or bandpass filter that is the easiest to fabricate and/or the least thick so as to block a part of the incident radiation and thereby specialise first photodetector 1a with respect to second photodetector 1b.

In a particular embodiment, an anti-reflective layer (not represented) is used. Depending on the embodiments, the anti-reflective layer can be arranged on second filter 4b, i.e. second filter 4b separates the anti-reflective layer and photodetectors 1a and 1 b. As a variant, the anti-reflective layer is deposited on second photodetector 1b and on first filter 4a. The anti-reflective layer separates second filter 4b and first filter 4a. In advantageous manner, a first anti-reflective layer is deposited on photodetectors 1a and 1b and a second anti-reflective layer is deposited on second filter 4b or in contact with second filter 4b. Depending on the embodiments, the anti-reflective layer can be deposited on the first filter or between first photodetector 1a and first filter 4a. The anti-reflective layer is advantageously configured to allow infrared radiation to pass.

In another particular embodiment, a passivation layer is used to cover first and/or second photodetectors 1a and 1b. In advantageous manner, the passivation layer is arranged between first photodetector 1a and first filter 4a. The passivation layer advantageously presents a thickness comprised between 10 nm and 2000 nm. The use of a passivation layer is particularly advantageous to limit pollution of the non-filtered band. For example, pollution of the non-filtered band may result in contamination with elements external to the device or by diffusion of contaminants. The passivation layer enables the contaminants to be diverted away from the photodetectors and/or from the filters so as not to modify the optic and/or electric performances. The contaminants are for example gold or copper.

It is advantageous to use a continuous passivation layer that covers first and second photodetectors 1a and 1b in monolithic manner. The continuous passivation layer makes for a better control of the thermomechanical stresses by smoothing out the stresses on the first and second photodetector. It is particularly advantageous to provide for the material used to form the passivation layer to be a material presenting a low diffusion coefficient of the contaminating species.

In a particular embodiment, an adhesion promoter is placed between the photodetectors and/or filters and the passivation layer.

In a particular embodiment, the passivation layer is made from a material chosen from Ge, ZnS, CdTe, $SiO_x$, $SiN_x$ so as to simultaneously form a passivation layer and an anti-reflective layer. The anti-reflective layer can be constituted by a single layer made from a single material or by a stack of several layers made from different materials.

The inventors also observed that it is advantageous to use first and second photodetectors that are sensitive to the first wavelength range and to the second wavelength range and that are not sensitive between these two wavelength ranges. Specialisation of first photodetector 1a with respect to second photodetector 1b is thereby easier to achieve as the constraint on the cut-off frequency of first filter 4a is reduced.

This embodiment is also advantageous as the constraints on second filter 4b are also reduced.

However, in a large number of cases, the photodetectors are sensitive to at least a third wavelength range that is situated between the first and the second wavelength range. It is then advantageous to use a dual-band filter.

It is apparent that using a photodetector having a sensitivity that extends beyond the first wavelength range and beyond the second wavelength range enables certain technological constraints linked to the fabrication methods of the photodetectors and/or to the materials used to be relaxed.

However, using photodetectors that are sensitive outside the first wavelength range and outside the second wavelength range results in the addition of parasite signals originating from undesired radiation ranges.

Filtering system 4 is configured to block this third wavelength range. More particularly, the third wavelength range is blocked by second filter 4b.

Figure 3A:
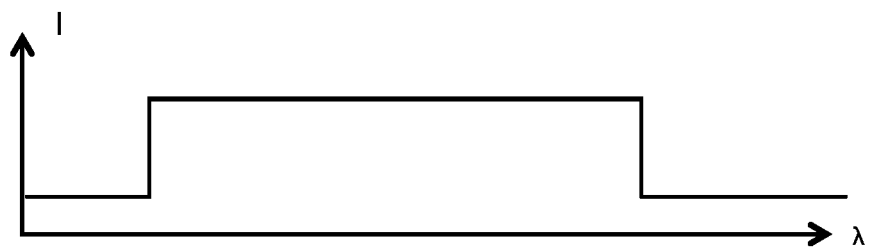
FIGS. 3a-3f represent intensity, transmittance and absorbance plots of the different components constituting the detection device according to a first embodiment, in schematic manner.
Figure 3B:
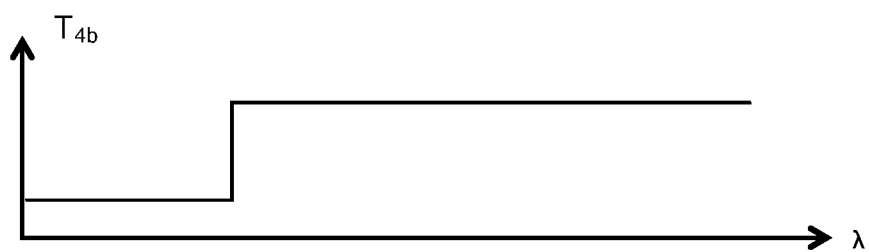
Figure 4A:
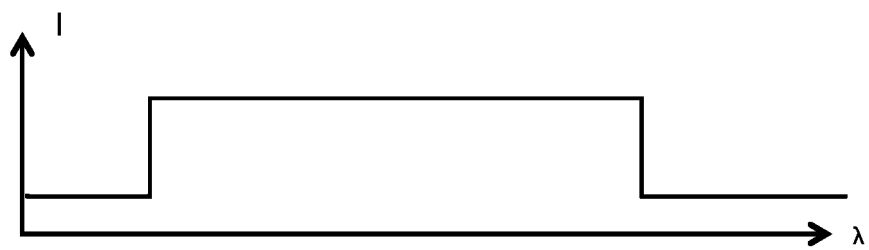
FIGS. 4a-4f represent intensity, transmittance and absorbance plots of the different components constituting the detection device according to a second embodiment, in schematic manner.
Figure 4B:
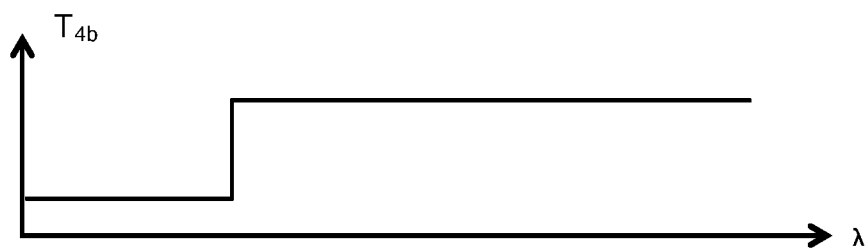

In a particularly advantageous embodiment illustrated by the transmission curve plots of FIGS. 3b and 4b, second filter 4b is a high-pass filter that is configured to cut off the wavelengths below the bottom end of the interval defined by the first and second wavelength ranges. Such a filter makes it possible to block the parasite radiation that corresponds to the wavelengths lower than the cut-off wavelength and that may be absorbed by photodetectors 1a and 1b.

Is this particular case, first filter 4a can be a high-pass filter, a low-pass filter or a passband filter.

Figure 3C:
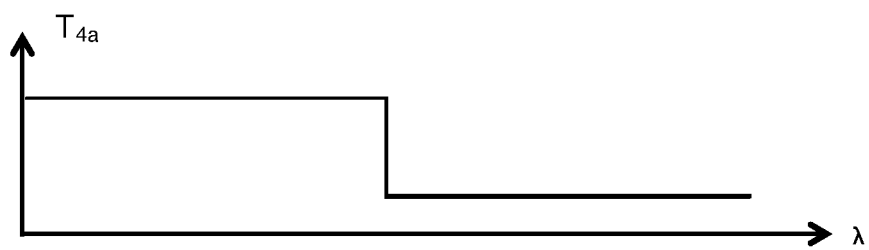
Figure 3D:
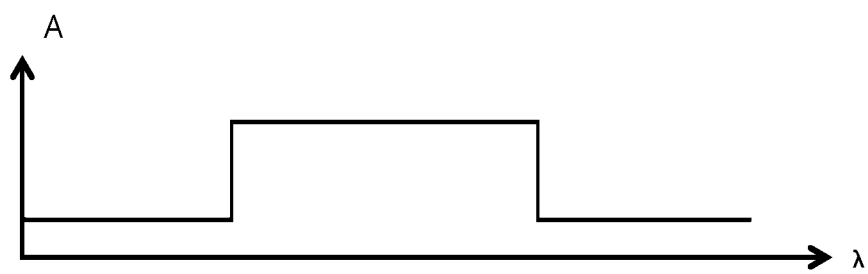
Figure 3E:
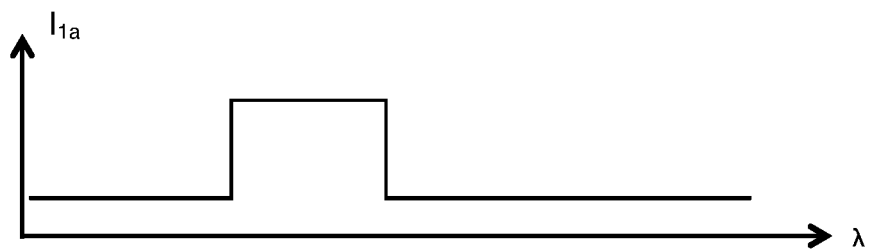
Figure 3F:
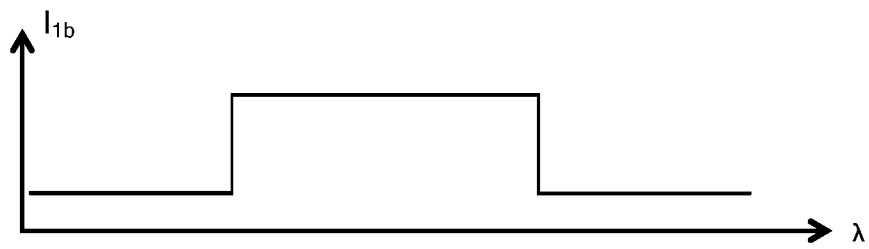

If first filter 4a is a low-pass filter the transmission curve plot of which is illustrated in FIG. 3c, the first wavelength range presents shorter wavelengths than the second wavelength range. First photodetector 1a only receives the wavelength range assigned to the shortest wavelengths as illustrated by the intensity curve plot of FIG. 3e. Second photodetector 1b receives both the wavelength ranges as illustrated by the intensity curve plot of FIG. 3f. FIG. 3d represents the absorption wavelength range of first and second photodetectors 1a and 1b.

Figure 4C:
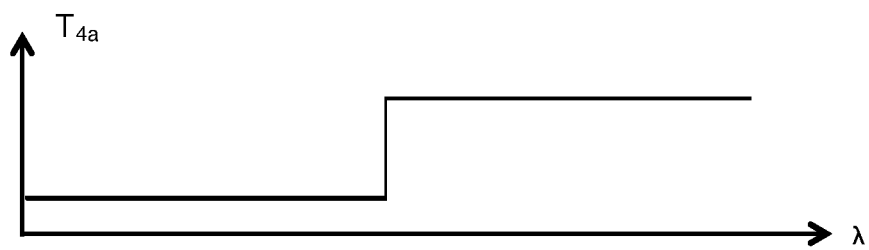
Figure 4D:
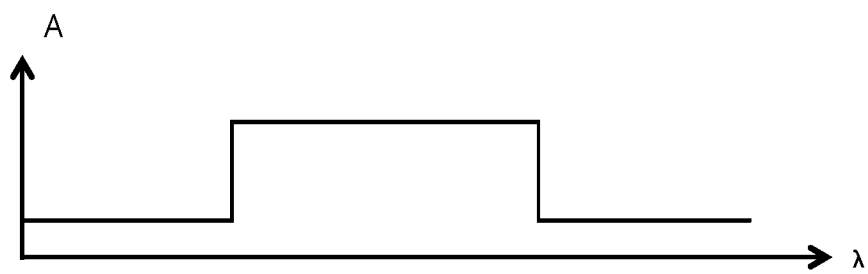
Figure 4E:
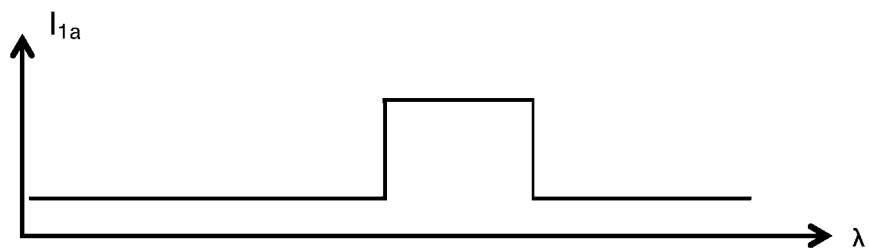
Figure 4F:
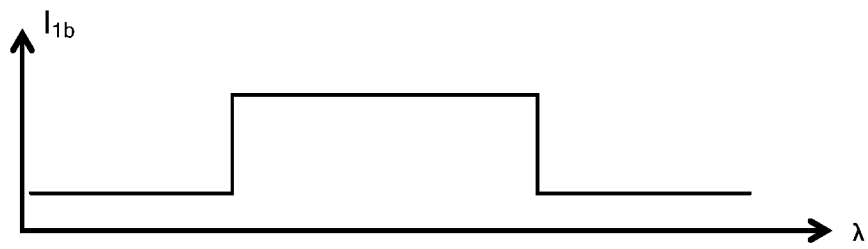

If first filter 4a is a high-pass filter the transmission curve plot of which is illustrated in FIG. 4c, the first wavelength range represents longer wavelengths than the second wavelength range. First photodetector 1a only receives the wavelength range associated with the longest wavelengths as illustrated by the intensity curve plot of FIG. 4e. Second photodetector 1b receives both the wavelength ranges as illustrated by the intensity curve plot of FIG. 4f. FIG. 4d represents the absorption wavelength range of first and second photodetectors 1a and 1b.

If the first filter 4a is a passband filter (not represented), the first wavelength range can present shorter or longer wavelengths than the second wavelength range depending on the characteristics of first filter 4a. If first filter 4a is configured to allow the shortest wavelengths to pass, the operation is then equivalent to a low-pass filter. If first filter 4a is configured to allow the longest wavelengths to pass, the operation is then equivalent to a high-pass filter.

Figure 5A:
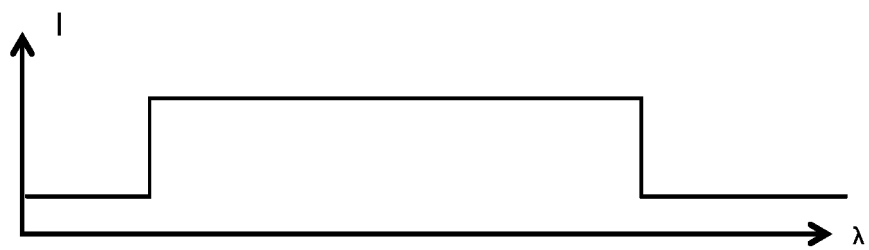
FIGS. 5a-5f represent intensity, transmittance and absorbance plots of the different components constituting the detection device according to a third embodiment, in schematic manner.
Figure 5B:
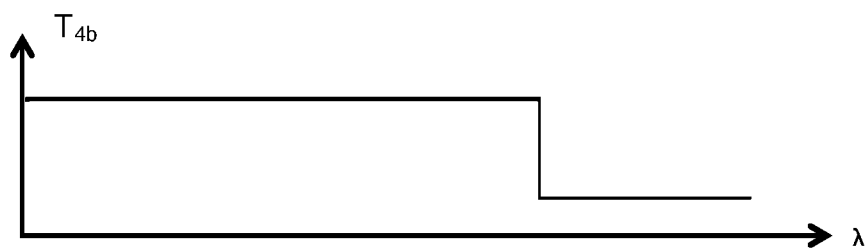
Figure 5D:
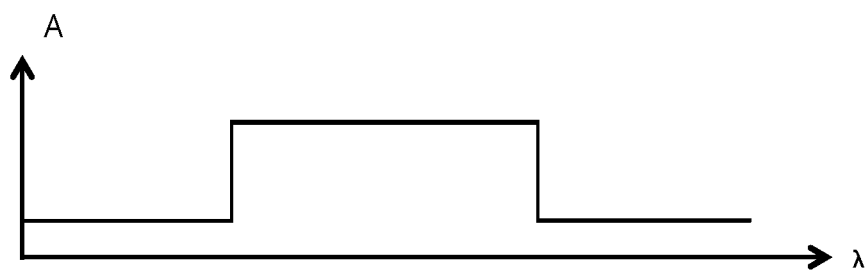
Figure 6A:
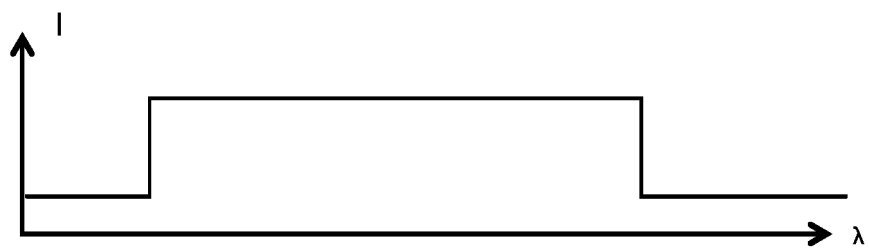
FIGS. 6a-6f represent intensity, transmittance and absorbance plots of the different components constituting the detection device according to a fourth embodiment, in schematic manner.
Figure 6B:
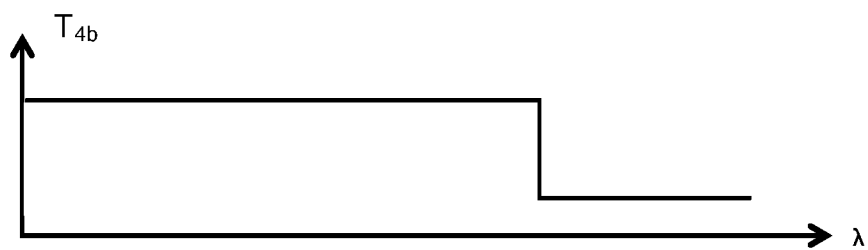

In another embodiment illustrated by the transmission curve plots of FIGS. 5b and 6b, second filter 4b is a low-pass filter that is configured to cut off the wavelengths above the top end of the interval defined by the first and second wavelength ranges. Such a filter blocks the parasite radiation that corresponds to the wavelengths higher than the cut-off wavelength and that may be absorbed by photodetectors 1a and 1b (FIG. 5d).

In this particular case, first filter 4a can be a high-pass filter, a low-pass filter or a bandpass filter.

Figure 5C:
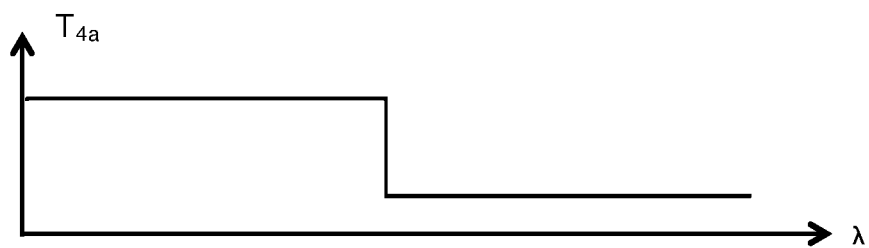
Figure 5E:
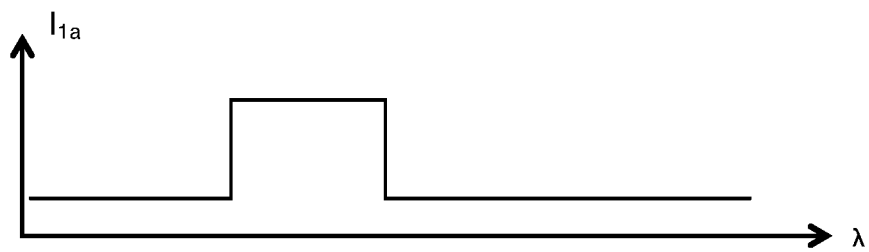
Figure 5F:
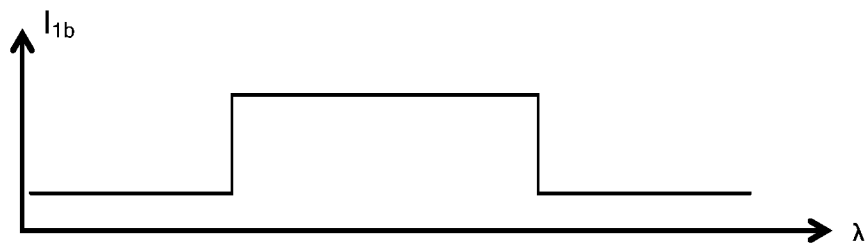

If first filter 4a is a low-pass filter the transmission curve plot of which is illustrated in FIG. 5c, the first wavelength range presents shorter wavelengths than the second wavelength range. First photodetector 1a only receives the wavelength range associated with the shortest wavelengths as illustrated by the intensity curve plot of FIG. 5e. Second photodetector 1b receives both the wavelength ranges as illustrated by the intensity curve plot of FIG. 5f. FIG. 5d represents the absorption wavelength range of first and second photodetectors 1a and 1b.

Figure 6C:
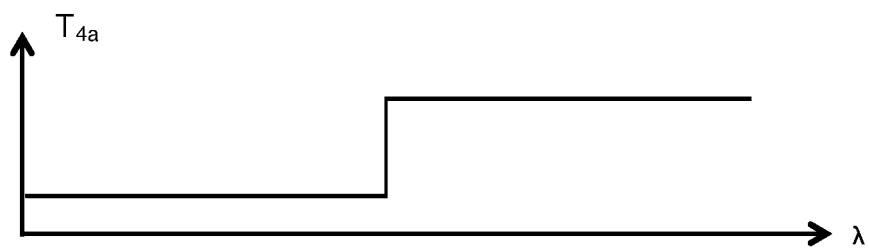
Figure 6D:
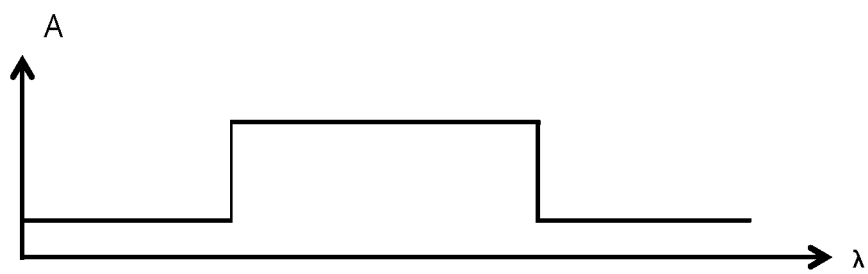
Figure 6E:
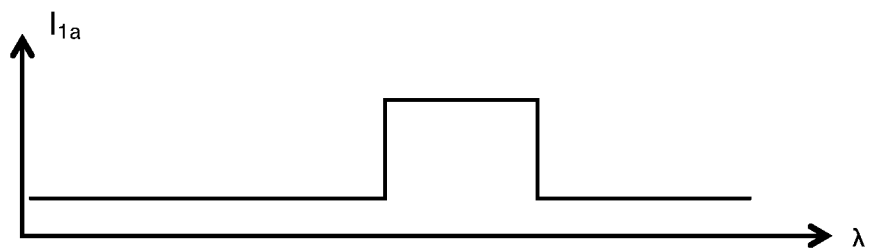
Figure 6F:
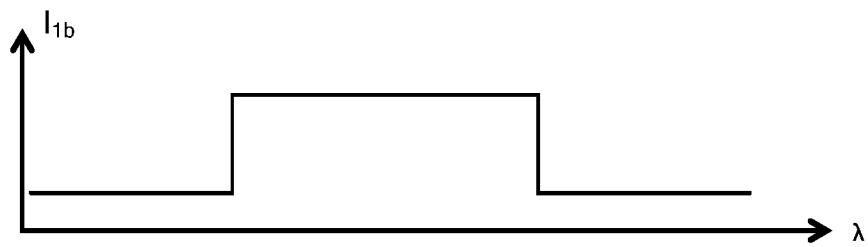

If first filter 4a is a high-pass filter the transmission curve plot of which is illustrated in FIG. 6c, the first wavelength range presents longer wavelengths than the second wavelength range. First photodetector 1a only receives the wavelength range associated with the longest wavelengths as illustrated by the intensity curve plot of FIG. 6e. Second photodetector 1b receives both the wavelength ranges as illustrated by the intensity curve plot of FIG. 6f. FIG. 6d represents the absorption wavelength range of first and second photodetectors 1a and 1b.

If first filter 4a is a bandpass filter (not represented), the first wavelength range can present shorter or longer wavelengths than the second wavelength range depending on the characteristics of first filter 4a. If first filter 4a is configured to allow the shortest wavelengths to pass, the operation is then equivalent to a low-pass filter. If first filter 4a is configured to allow the longest wavelengths to pass, the operation is then equivalent to a high-pass filter.

Figure 7A:
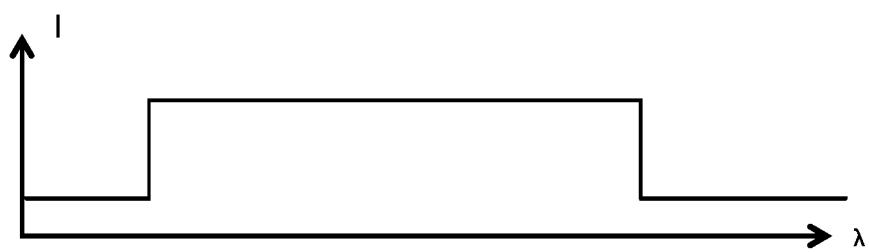
FIGS. 7a-7f represent intensity, transmittance and absorbance plots of the different components constituting the detection device according to a fifth embodiment, in schematic manner.
Figure 7B:
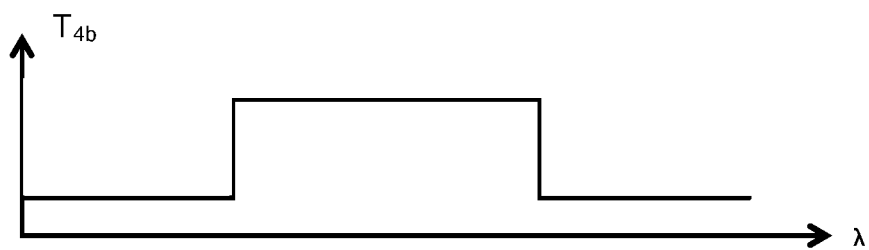

In a particularly advantageous embodiment illustrated by the transmission curve plot of FIG. 7b, second filter 4b is a bandpass filter that is configured to cut off the wavelengths below the bottom end of the interval defined by the first and second wavelength ranges and to cut off the wavelengths above the top end of the interval defined by the first and second wavelength ranges. Such a filter blocks the parasite radiations that correspond to the wavelengths lower than and higher than the two cut-off wavelengths and that may be absorbed by photodetectors 1a and 1b (FIG. 7d).

In this particular case, first filter 4a can be a high-pass filter, a low-pass filter or a bandpass filter.

Figure 7C:
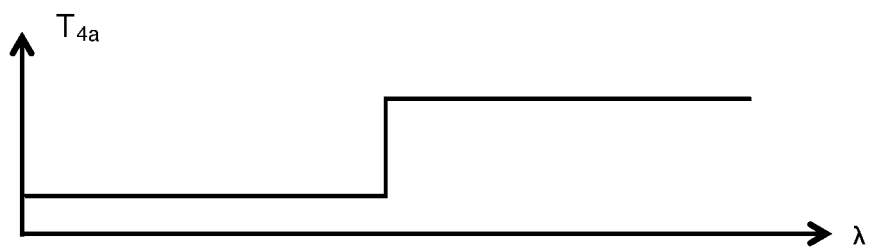
Figure 7D:
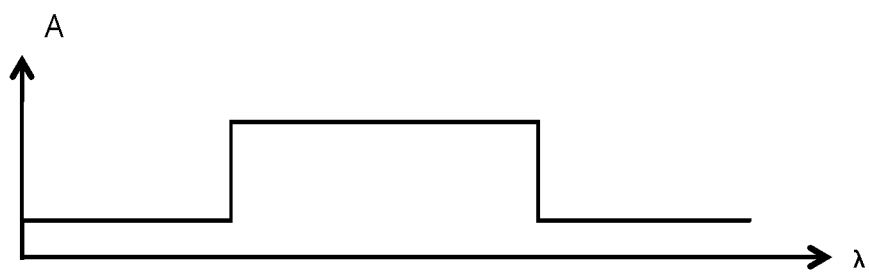
Figure 7E:
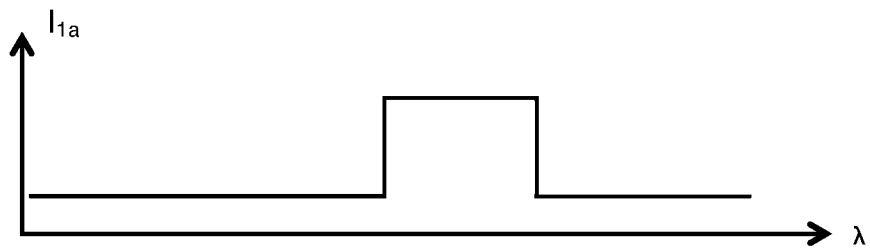
Figure 7F:
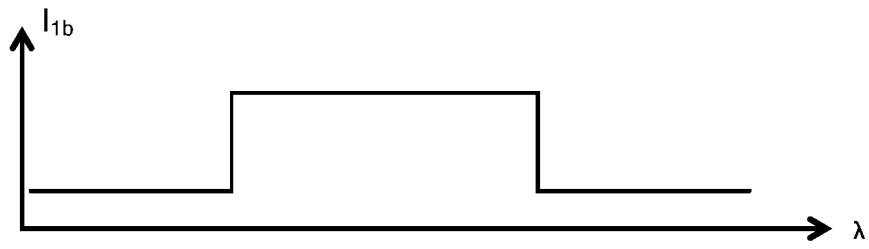

If first filter 4a is a high-pass filter the transmission curve plot of which is illustrated in FIG. 7c, the first wavelength range presents longer wavelengths than the second wavelength range. First photodetector 1a only receives the wavelength range associated with the longest wavelengths as illustrated by the intensity curve plot of FIG. 7e. Second photodetector 1b receives both wavelength ranges as illustrated by the intensity curve plot of FIG. 7f. FIG. 7d represents the absorption wavelength range of first and second photodetectors 1a and 1b.

If first filter 4a is a low-pass filter (not represented), the first wavelength range presents shorter wavelengths than the second wavelength range. First photodetector 1a only receives the wavelength range associated with the shortest wavelengths. Second photodetector 1b receives both the wavelength ranges.

If first filter 4a is a bandpass filter (not represented), the first wavelength range can present shorter or longer wavelengths than the second wavelength range depending on the characteristics of first filter 4a. If first filter 4a is configured to allow the shortest wavelengths to pass, the operation is then equivalent to a low-pass filter. If first filter 4a is configured to allow the longest wavelengths to pass, the operation is then equivalent to a high-pass filter.

Figure 8A:
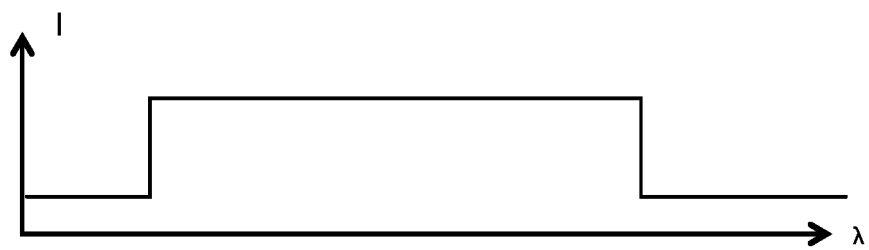
FIGS. 8a-8f represent plots of intensity, transmittance and absorbance of the different components constituting the detection device according to a sixth embodiment, in schematic manner.
Figure 8B:
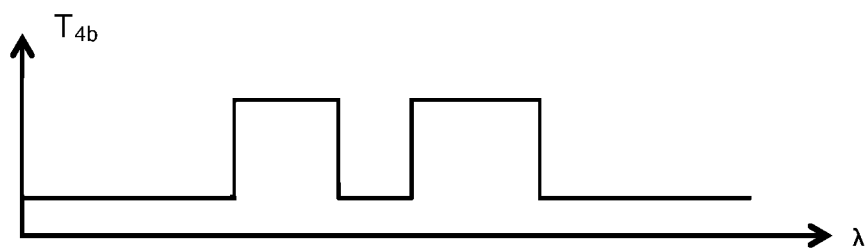
Figure 8C:
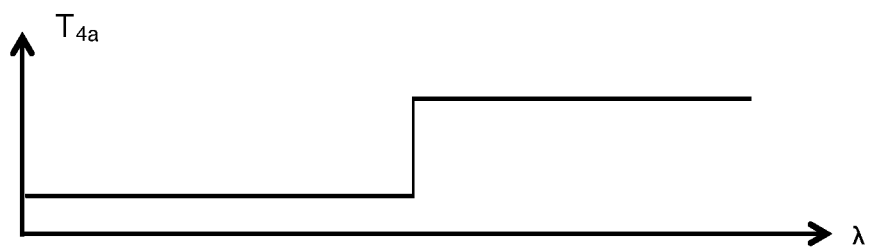
Figure 8D:
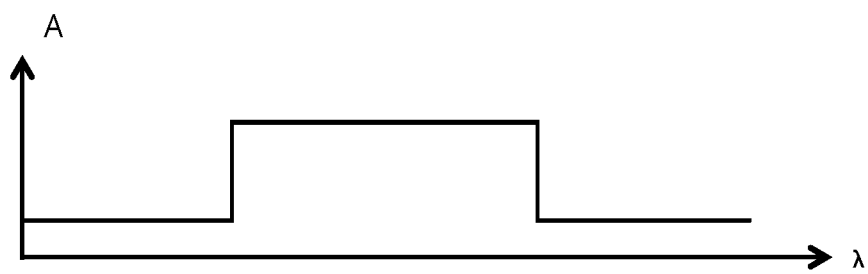
Figure 8E:
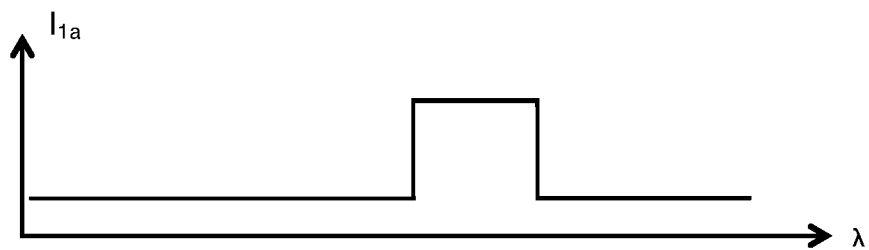
Figure 8F:
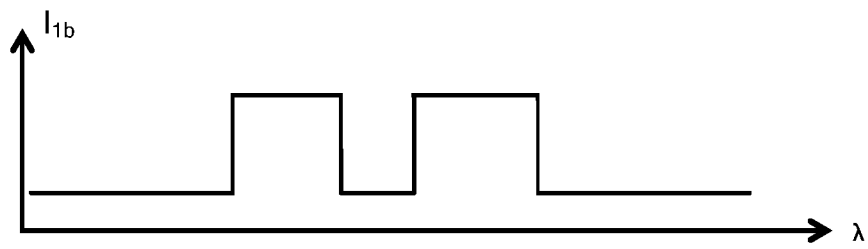

In an embodiment illustrated in FIGS. 8a to 8f, second filter 4b is a dual-band filter the transmission curve plot of which is illustrated in FIG. 8b. The dual-band filter is associated with a first filter 4a of high-pass type the transmission curve plot of which is illustrated in FIG. 8c. First photodetector 1a only receives the wavelength range associated with the longest wavelengths as illustrated by the intensity curve plot of FIG. 8e. Second photodetector 1b receives both the wavelength ranges as illustrated by the intensity curve plot of FIG. 8f. FIG. 8d represents the absorption wavelength range of first and second photodetectors 1a and 1b.

As for the other embodiments, first filter 4a can be replaced by a bandpass filter or by a low-pass filter that is illustrated by FIGS. 9a to 9f.

FIGS. 3a, 4a, 5a, 6a, 7a, 8a and 9a represent the light intensity of the observed scene.

Figure 9A:
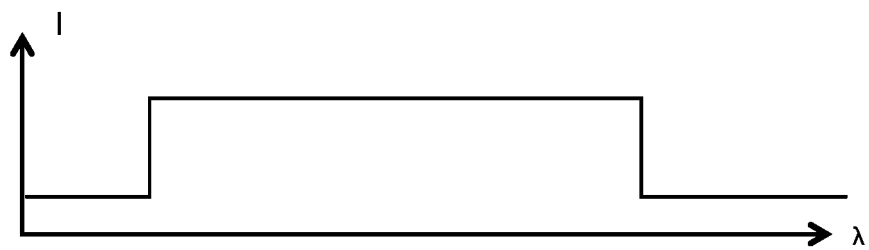
FIGS. 9a-9f represent intensity, transmittance and absorbance plots of the different components constituting the detection device according to a seventh embodiment, in schematic manner.
Figure 9B:
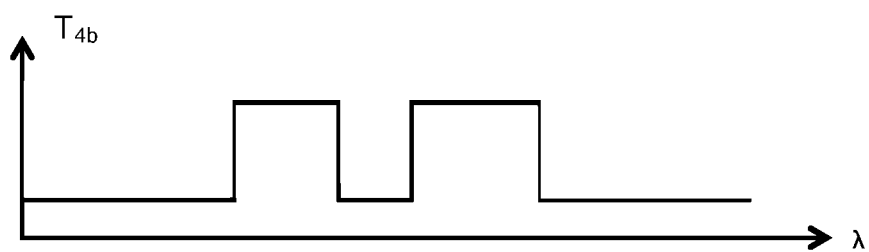
Figure 9C:
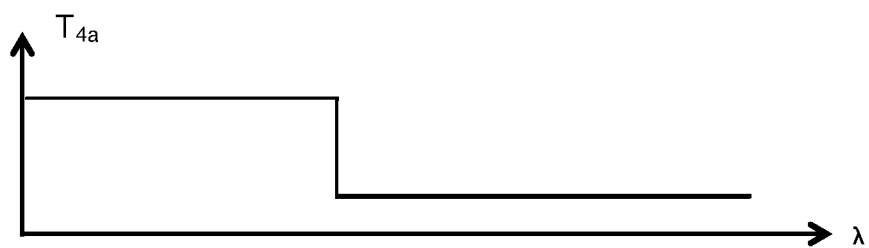
Figure 9D:
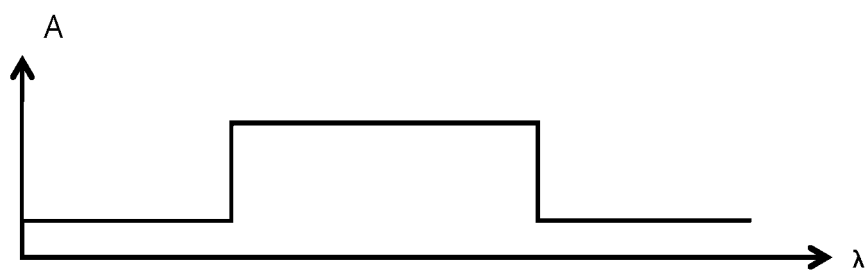
Figure 9E:
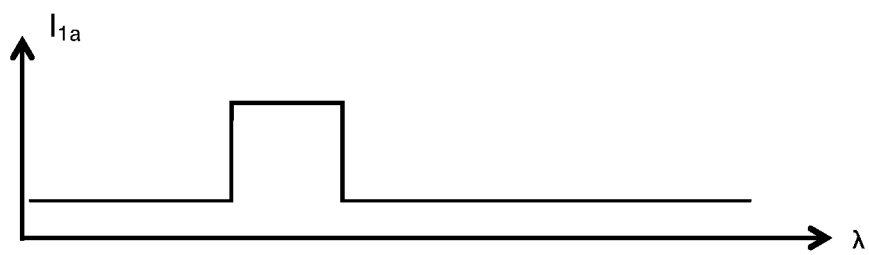
Figure 9F:
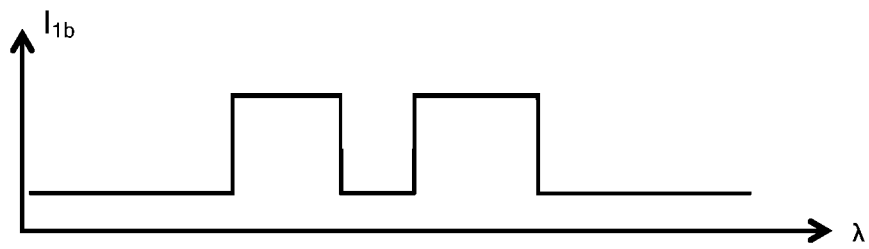

The transmission curve plot of the low-pass filter is illustrated in FIG. 9c. first photodetector 1a only receives the wavelength range associated with the shortest wavelengths as illustrated by intensity curve plot of FIG. 9e. Second photodetector 1b receives both the wavelengths ranges as illustrated by the intensity curve plot of FIG. 9f. FIG. 9d represents the wavelength range absorbed by first and second photodetectors 1a and 1 b.

Figure 10:
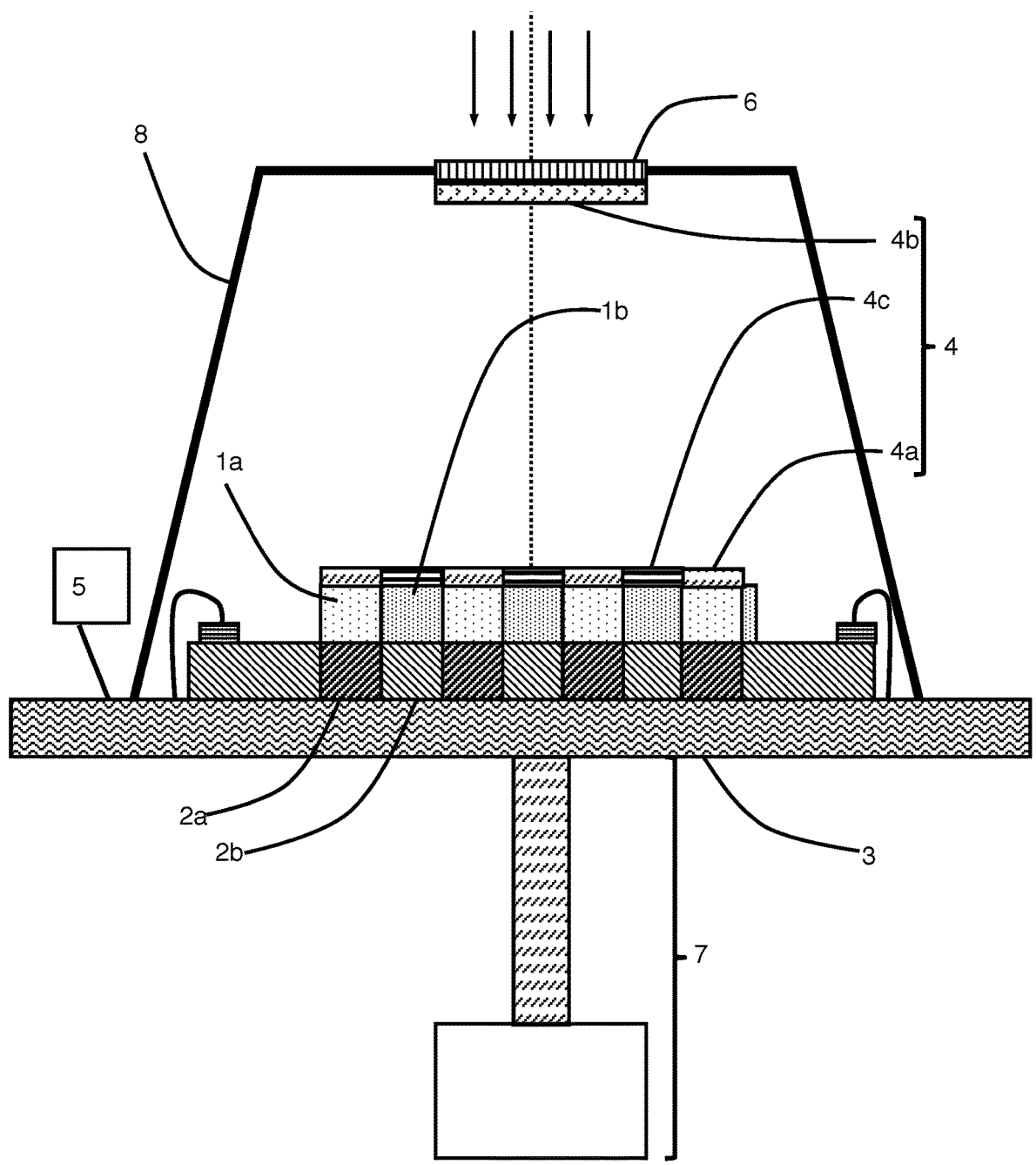
FIG. 10 represents another embodiment of a detection device provided with two photodetectors and with a filter on the cold shield, in schematic manner.

In an alternative embodiment illustrated in FIG. 10, second photodetector 1b is covered by a third filter 4c. Third filter 4c is configured to allow the second wavelength range to pass and to block the first wavelength range. Third filter 4c can be an interference filter or an absorption filter.

Third filter 4c can be a low-pass filter or a high-pass filter the cut-off wavelength of which is located between the first wavelength range and the second wavelength range. If the first filter is a low-pass filter, the second filter is a high-pass filter and vice versa.

As an alternative, it is also possible to provide for third filter 4c to be a bandpass filter that allows the second wavelength range to pass and that blocks the first wavelength range. This embodiment is a less advantageous than the previous embodiment as a bandpass filter is thicker than a low-pass or a high-pass filter.

Third filter 4c is a filter placed directly on second photodetector 1b, i.e. on a part of the focal plane array. Third filter 4c is not deposited on first photodetector 1a which means that third filter 4c only covers second photodetector 1b and that it leaves first photodetector 1a uncovered. Third filter 4c is in physical contact with second photodetector 1b. Third filter 4c limits the crosstalk between first photodetector 1a and adjacent second photodetector 1b.

By means of this particular configuration, second photodetector 1b only receives a part of the incident radiation. Second photodetector 1b receives the second wavelength range and does not receive the first wavelength range. Each photodetector provides data representative of the observed wavelength range. The processing circuit can be simplified as it is no longer necessary to compare the signals coming from the two photodetectors.

In the different examples illustrating the FIGS. 3a, 4a, 5a, 6a, 7a, 8a and 9a, the emission curve of the observed scene extends beyond the first and second wavelength ranges.

The detection device can be fabricated simply in the following manner. First photodetector 1a and second photodetector 1b are formed on a semi-conductor substrate. As the two photodetectors 1a and 1 b are sensitive to the same wavelength ranges, it is advantageous to fabricate the two photodetectors at the same time and with the same semiconductor materials. In a preferential embodiment, photodetectors 1a and 1b are identical.

The two photodetectors are offset along an axis parallel to the plane of the surface of the substrate and are in one and the same plane parallel to the plane of the surface of the substrate.

A first filter 4a is formed on first photodetector 1a so as to cover first photodetector 1a and to leave second photodetector 1b uncovered.

In a first alternative embodiment, first filter 4a is formed on first photodetector 1a and on second photodetector 1b. First filter 4a is then eliminated above second photodetector 1b.

In a second alternative embodiment, second photodetector 1b is protected by a sacrificial layer. First filter 4a is formed on first photodetector 1a and on the sacrificial layer. The sacrificial layer is eliminated so as to release second photodetector 1b devoid of a first filter.

Second filter 4b is then associated, for example placed into contact, with the substrate containing first photodetector 1a and second photodetector 1b. Second filter 4b is not formed by deposition on the substrate, it is formed independently and added on at a later stage.

In the alternative embodiment using third filter 4c, first filter 4a can be formed before or after third filter 4c. it is also possible to provide for first filter 4a and third filter 4c to be partly formed at the same time sharing several layers. In advantageous manner, third filter 4c is provided before second filter 4b is installed. Third filter 4c is arranged at a distance from second filter 4b.

For example purposes, it is advantageous to place first and second photodetectors 1a and 1b in a closed enclosure that is advantageously tightly sealed. This closed enclosure comprises an opening configured to allow the radiation to pass from the radiation source to first and second photodetectors 1a and 1b. It is particularly advantageous to place second filter 4b in this opening so as to allow the first and second wavelength ranges to pass and to block a part of the radiation that is not useful. The opening is advantageously a window 6 made from transparent material covered by second filter 4b. Second filter 4b can be situated inside the closed enclosure (FIG. 1) or outside the closed enclosure (FIG. 2). The whole surface of the window is advantageously covered by second filter 4b so as to only leave the useful signal in all the areas of the window.

In advantageous manner, the detection device is a cooled detection device, i.e. a device that is configured to operate at a temperature of less than 300K, preferably comprised between 40K and 300K and preferably less than 200K. The detection device can also be uncooled.

The detection device is advantageously coupled with a cooling system 7 to cool the detection device to its operating temperature.

The photodetectors of the detection device can be made from II-VI material, for example HgCdTe, or from III-V material, for example InGaAs, InSb or InAsSb.

Photodetectors 1a and 1b are advantageously surrounded by a cold shield 8 configured to block the incident radiation with the exception of window 6 allowing the incident radiation to pass. It appears particularly advantageous to place second filter 4b on this window 6 for passage of the incident radiation.

The areas covered by first filter 4a and the areas left uncovered by first filter 4a advantageously define an alternation between first photodetectors 1a and second photodetectors 1b.

This alternation between the first and second photodetectors can be expressed in the form of a checkerboard pattern or an alternation of strips represented by rows or columns of photodetectors.

In a preferential embodiment, the pressure inside cold shield 8 is lower than or equal to the pressure outside cold shield 8. It is advantageous to provide for the pressure inside cold shield 8 to be lower than atmospheric pressure, for example less than 1013 hPa.

In a particular embodiment, the pressure inside the cold shield is less than $10^{-4}$ Pa.

The invention claimed is:

1. Multispectral detection device comprising:
    a first photodetector and a second photodetector each sensitive to a first wavelength range and to a second wavelength range different from the first wavelength range, the first photodetector delivering a first signal representative of captured radiation and the second photodetector delivering a second signal representative of captured radiation, the first wavelength range and the second wavelength range being infrared wavelength ranges, a first filter configured to allow the first wavelength range to pass and to block the second wavelength range, the first filter covering the first photodetector and leaving the second photodetector uncovered, the first filter covering the first photodetector so as to block the passage of the second wavelength range in the first photodetector and to apply thermomechanical stress on the first photodetector, a second filter arranged at a distance from the first photodetector and from the second photodetector and at a distance from the first filter, the second filter being configured to allow the first wavelength range and the second wavelength range to pass, the second filter being configured to block a higher wavelength than a longest of the wavelengths in the first and second wavelength ranges or to block a lower wavelength than a shortest of the wavelengths in the first and second wavelength ranges, and a passivation layer continuously covering the first photodetector and the second photodetector, the passivation layer being arranged between the first photodetector and the first filter and having a thickness comprised between 10 nm and 2000 nm to smooth thermomechanical stress.

2. Multispectral detection device according to claim 1 wherein the second photodetector is devoid of a filter configured to block the first wavelength range so as to capture the first wavelength range and the second wavelength range, the multispectral detection device comprising a processing circuit receiving first and second signals coming from the first and second photodetectors, the processing circuit providing data relative to the radiation of the second wavelength range by comparing the first signal with the second signal.

3. Multispectral detection device according to claim 1 wherein the second photodetector is covered by a third filter configured to block the first wavelength range and to allow the second wavelength range to pass.

4. Multispectral detection device according to claim 1 wherein the second filter is chosen from low-pass, high-pass, bandpass and dual-band filters.

5. Multispectral detection device according to claim 1 wherein the first filter is a low-pass, high-pass or bandpass filter cutting off the second wavelength range.

6. Multispectral detection device according to claim 1 wherein the second filter is arranged at a distance from the first filter and from the second photodetector, the second filter being separated from the first filter and from the second photodetector by a layer of gas or by a vacuum.

7. Multispectral detection device according to claim 1 wherein it comprises a cold shield configured to focus the incident radiation by means of an aperture for passage of the incident radiation and in that the second filter is arranged in said aperture.

8. Multispectral detection device according to claim 7 wherein the cold shield defines a closed enclosure containing the first and second photodetectors and in that the second filter is located inside the closed enclosure.

9. Multispectral detection device according to claim 7 wherein the cold shield defines a closed enclosure containing the first and second photodetectors and in that the second filter is located outside the closed enclosure.

10. Multispectral detection device according to claim 7 comprising a cooling system configured to cool the multispectral detection device below 200K.

11. Fabrication method of a multispectral detection device characterised in that it comprises the following steps:

providing a substrate comprising first and second photodetectors each sensitive to a first wavelength range and to a second wavelength range different from the first wavelength range and a passivation layer continuously covering the first photodetector and the second photodetector, the first photodetector delivering a first signal representative of a captured radiation and the second photodetector delivering a second signal representative of a captured radiation, the first wavelength range and the second wavelength range being infrared wavelength ranges, and the passivation layer being arranged between the first photodetector and the first filter and having a thickness comprised between 10 nm and 2000 nm to smooth stress, forming a first filter configured to allow the first wavelength range to pass and to block the second wavelength range, the first filter covering the first photodetector and leaving the second photodetector uncovered, the first filter covering the first photodetector so as to block the passage of the second wavelength range in the first photodetector and to apply thermomechanical stress on the first photodetector, forming a second filter arranged at a distance from the first and second photodetectors and at a distance from the first filter, the second filter being configured to allow the first wavelength range and the second wavelength range to pass, the second filter being configured to block a higher wavelength than the longest of the wavelengths in the first and second wavelength ranges and/or to block a lower wavelength than the shortest of the wavelengths in the first and second wavelength ranges.

12. Fabrication method according to claim 11 comprising, before the second filter is formed:

forming a third filter configured to allow the second wavelength range to pass and to block the first wavelength range, the third filter covering the second photodetector and leaving the first photodetector uncovered, the third filter being in contact with the second photodetector so as to block the passage of the first wavelength range in the second photodetector.

* * * * *